US012574448B2

(12) United States Patent
Vaduvatha et al.

(10) Patent No.: US 12,574,448 B2
(45) Date of Patent: Mar. 10, 2026

(54) DATA COMPRESSION ENGINE

(71) Applicant: Google LLC, Mountain View, CA (US)

(72) Inventors: Srinivas Vaduvatha, San Jose, CA
(US); Weiwei Jiang, Santa Clara, CA
(US); Prashant Chandra, San Jose,
CA (US); Opeoluwa Oladipo, San
Jose, CA (US); Jiazhen Zheng, Santa
Clara, CA (US); Hugh McEvoy Walsh,
Los Gatos, CA (US); Weihuang Wang,
Los Gatos, CA (US); **Abhishek
Agarwal**, Santa Clara, CA (US)

(73) Assignee: Google LLC, Mountain View, CA (US)

( * ) Notice: Subject to any disclaimer, the term of this
patent is extended or adjusted under 35
U.S.C. 154(b) by 364 days.

(21) Appl. No.: 18/200,074

(22) Filed: May 22, 2023

(65) Prior Publication Data

US 2024/0064215 A1 Feb. 22, 2024

Related U.S. Application Data

(60) Provisional application No. 63/357,326, filed on Jun.
30, 2022.

(51) Int. Cl.
| | |
|---|---|
| *H04L 69/04* | (2022.01) |
| *H03M 7/30* | (2006.01) |
| *H03M 7/48* | (2006.01) |

(52) U.S. Cl.
CPC .............. *H04L 69/04* (2013.01); *H03M 7/48*
(2013.01); *H03M 7/6011* (2013.01); *H03M
7/70* (2013.01)

(58) Field of Classification Search
CPC ...................................................... H03M 7/48
See application file for complete search history.

(56) References Cited

U.S. PATENT DOCUMENTS

| | | | | |
|---|---|---|---|---|
| 2002/0027563 A1* | 3/2002 | Van Doan | ............... | G06T 11/60 |
| | | | | 345/630 |
| 2004/0177295 A1* | 9/2004 | Barone | ................... | H03M 7/48 |
| | | | | 714/724 |

(Continued)

FOREIGN PATENT DOCUMENTS

| | | |
|---|---|---|
| WO | 0232039 A2 | 4/2002 |

OTHER PUBLICATIONS

Extended European Search Report for European Patent Application
No. 23175510.9 dated Nov. 3, 2023. 12 pages.

(Continued)

*Primary Examiner* — Nishant Divecha
*Assistant Examiner* — James P Seymour
(74) *Attorney, Agent, or Firm* — Lerner David LLP

(57) ABSTRACT

Compressing connection state information for a network
connection including receiving an input bitmap having a
sequence of bits describing transmit states and receive
states; partitioning the input bitmap into a plurality of equal
size blocks; partitioning each of the blocks into a plurality of
equal sized sectors; generating a block valid sequence
indicating the blocks having at least one bit set; generating,
for each block having at least one bit set, a sector informa-
tion sequence, the sector information sequence indicating,
for the corresponding block, the sectors that have at least one
bit set and an encoding type for each sector; and generating
one or more symbols by encoding each sector that has at
least one bit set.

16 Claims, 6 Drawing Sheets

(56) References Cited

U.S. PATENT DOCUMENTS

| | | | |
|---|---|---|---|
| 2013/0223213 A1* | 8/2013 | Asterjadhi | H04L 1/0025 |
| | | | 370/230 |
| 2016/0241577 A1* | 8/2016 | Johnson | G06F 16/278 |

OTHER PUBLICATIONS

Kanellopoulos et al. SMASH: Co-designing Software Compression and Hardware-Accelerated Indexing for Efficient Sparse Matrix Operations. Arxiv.org, Cornell University Library, 201 Olin Library Cornell University Ithaca, NY 14853, Oct. 23, 2019 (Oct. 23, 2019). 15 pages.

\* cited by examiner

DATA COMPRESSION ENGINE

CROSS-REFERENCE TO RELATED APPLICATIONS

The present application claims priority from U.S. Provisional Application No. 63/357,326 filed on Jun. 30, 2022, the disclosure of which is hereby incorporated herein by reference.

BACKGROUND

Network architectures may be connection-oriented. In such architectures, the states of connections may be stored in a system memory and retrieved from the memory as needed. For example, a connection state for a communication between two nodes may be stored to system memory to make room for a conflicting connection that has priority, and retrieved when the conflicting connection's processing is complete. However, there is a limited system memory bandwidth, and thus there is a desire to minimize the memory bandwidth necessary for connection state storage and retrieval so as to maximize the memory bandwidth available for other operations.

BRIEF SUMMARY

It has been recognized that the system memory bandwidth required for connection state storage and retrieval may be minimized by compressing the connection state data prior to storage in the memory.

It has been recognized that a system may employ a network-on-chip (NoC) and have a connection-oriented architecture and may store and retrieve connection states for system nodes communicating over the NoC. It has been further recognized that the NoC may use the system's off-chip memory, such as a dynamic random-access memory (DRAM), to store connection states, although the off-chip memory may be a bottleneck of system performance, and therefore the NoC-DRAM bandwidth required for storing and retrieving connection state should be minimized.

In view of the desire for minimizing the memory bandwidth required for storage and retrieval of connection states to/from a memory, the presently disclosed technology is provided.

In one aspect, the technology provides a method for compressing connection state information including receiving an input bitmap having a sequence of bits describing transmit states and receive states for packets in a connection between a first node on a network and a second node on the network, each bit in the sequence of bits being either set or unset; partitioning the input bitmap into a plurality of equal size blocks; partitioning each of the blocks into a plurality of equal sized sectors; generating a block valid sequence indicating the blocks having at least one bit set; generating, for each block having at least one bit set, a sector information sequence, the sector information sequence indicating, for the corresponding block, the sectors that have at least one bit set and an encoding type for each sector; and generating one or more symbols by encoding each sector that has at least one bit set, according to the encoding type for the sector, such that each encoded sector corresponds to one of the symbols.

In another aspect, the technology provides a system for compressing connection state information including at least one processor for controlling receiving an input bitmap having a sequence of bits describing transmit states and receive states for packets in a connection between a first node on a network and a second node on the network, each bit in the sequence of bits being either set or unset; partitioning the input bitmap into a plurality of equal size blocks; partitioning each of the blocks into a plurality of equal sized sectors; generating a block valid sequence indicating the blocks having at least one bit set; generating, for each block having at least one bit set, a sector information sequence, the sector information sequence indicating, for the corresponding block, the sectors that have at least one bit set and an encoding type for each sector; and generating one or more symbols by encoding each sector that has at least one bit set, according to the encoding type for the sector, such that each encoded sector corresponds to one of the symbols.

BRIEF DESCRIPTION OF THE DRAWINGS

The accompanying drawings are not intended to be drawn to scale. Also, for purposes of clarity not every component may be labeled in every drawing. In the drawings.

DETAILED DESCRIPTION

Examples of systems and methods are described herein. It should be understood that the words "example," "exemplary" and "illustrative" are used herein to mean "serving as an example, instance, or illustration." Any embodiment or feature described herein as being an "example," "exemplary" or "illustration" is not necessarily to be construed as preferred or advantageous over other embodiments or features. In the following description, reference is made to the accompanying figures, which form a part thereof. In the figures, similar symbols typically identify similar components, unless context dictates otherwise. Other embodiments may be utilized, and other changes may be made, without departing from the spirit or scope of the subject matter presented herein.

The example embodiments described herein are not meant to be limiting. It will be readily understood that the aspects of the present disclosure, as generally described herein, and illustrated in the figures, can be arranged, substituted, combined, separated, and designed in a wide variety of different configurations, all of which are explicitly contemplated herein.

Figure 1:
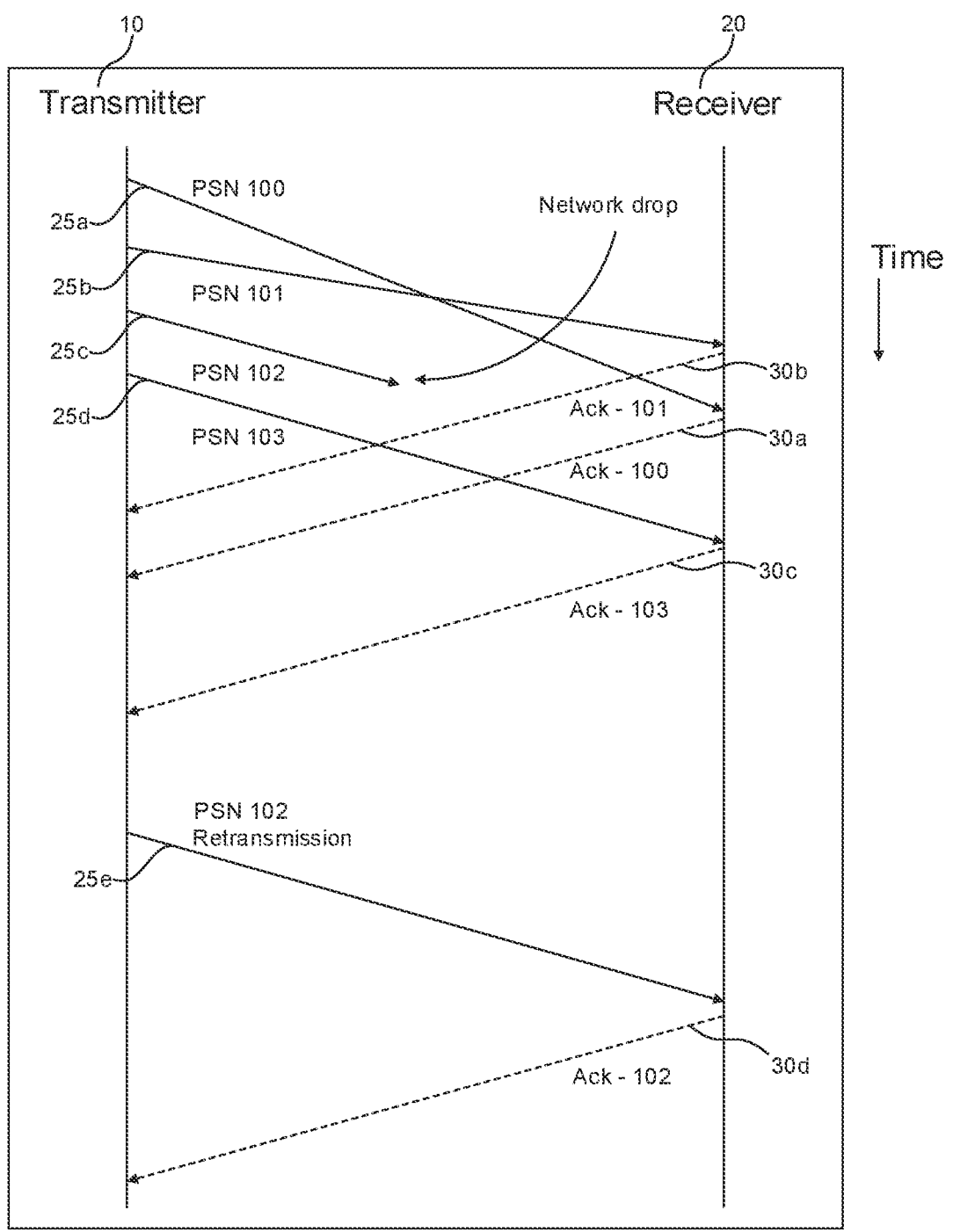
FIG. 1 is a timing diagram showing an example of timing of transmit packets and acknowledgement packets sent between a transmitter and receiver of a network.

The presently disclosed technology may be implemented in a packet-based network. FIG. 1 is a timing diagram showing an example of timing of transmit packets and acknowledgement packets sent between a transmitter 10 and receiver 20 of a network in which the technology is used. The transmitter 10 may be a physical node of the network and the receiver 20 may be another physical node of the network, although the transmitter and/or receiver are not necessarily physical nodes and may take other forms, such as virtual network nodes or logical network nodes. In any event, when the transmitter 10 and receiver 20 are engaged in communication with each other, they define a connection on the network.

As can be seen from FIG. 1, the transmitter 10 may send transmit packets, e.g., packets 25*a*, 25*b*, 25*c*, and 25*d* to the receiver 20 in a sequence, with each packet being associated with a sequence number denoting its position in the sequence. Receipt of receive packets received by the receiver 20, e.g., packets 25*a*, 25*b*, and 25*d*, may be acknowledged through acknowledgement signals sent from the receiver 20 to the transmitter 10, e.g., acknowledgement signals 30*a*, 30*b*, and 30*c*. As depicted in FIG. 1, the transit times from transmitter 10 to receiver 20 for the transmit packets may differ, causing the transmit packets to be received at the receiver 20 out of order, i.e., in a sequence different from the sequence in which the transmit packets are transmitted. For example, transmit packet 25*a* is transmitted before transmit packet 25*b*, but transmit packet 25*a* is received at receiver 20 after transmit packet 25*b*. Further, some transmit packets may be dropped by the network and not be received at the receiver 20, e.g., transmit packet 25*c*, for reasons such as network congestion. When a transmit packet is dropped it may be retransmitted while bearing its original sequence number, e.g., transmit packet 25*e*, and when the retransmitted packet is received by the receiver 20, the receiver 20 will send an acknowledgement signal for the retransmitted packet, e.g., acknowledgement signal 30*d*.

The communications between nodes in a packet network, like the packet transmissions and acknowledgements illustrated in FIG. 1, may be interleaved at any time with communications between one or more of the nodes and one or more other nodes in the network, such that transmission/reception of packets from several communications or connections require processing based on a connection state before transmission or reception of a given packet. Moreover, it is likely that as packets are being transmitted/received for a given connection it is desirable to store the state of the connection for later retrieval so that a different connection may be serviced. For example, if the connection of FIG. 1 is interleaved with communications in another connection, the status of the transmit packets and acknowledgement packets may be stored in a memory for later retrieval. The state of a communication on a packet-based network will be referred to as the connection state, and the connection state will be described by one or more bitmaps. The bitmaps each include a series of bits ordered by packet sequence number, i.e., the order of packet transmission, with each bit being either set or unset, and in which a set bit indicates that the packet corresponding to the sequence number has been transmitted or received, and an un-set bit indicates the packet corresponding to the sequence number has not been transmitted or received.

The bitmaps are formed from sliding windows that move along a sliding range of packet sequence numbers. The windows begin with the sequence number corresponding to the oldest unacknowledged packet and have an assigned length such that they end at a sequence number that is offset from the start by their assigned length. The assigned length may be determined based on, for example, one or more network congestion parameters.

Figure 2:
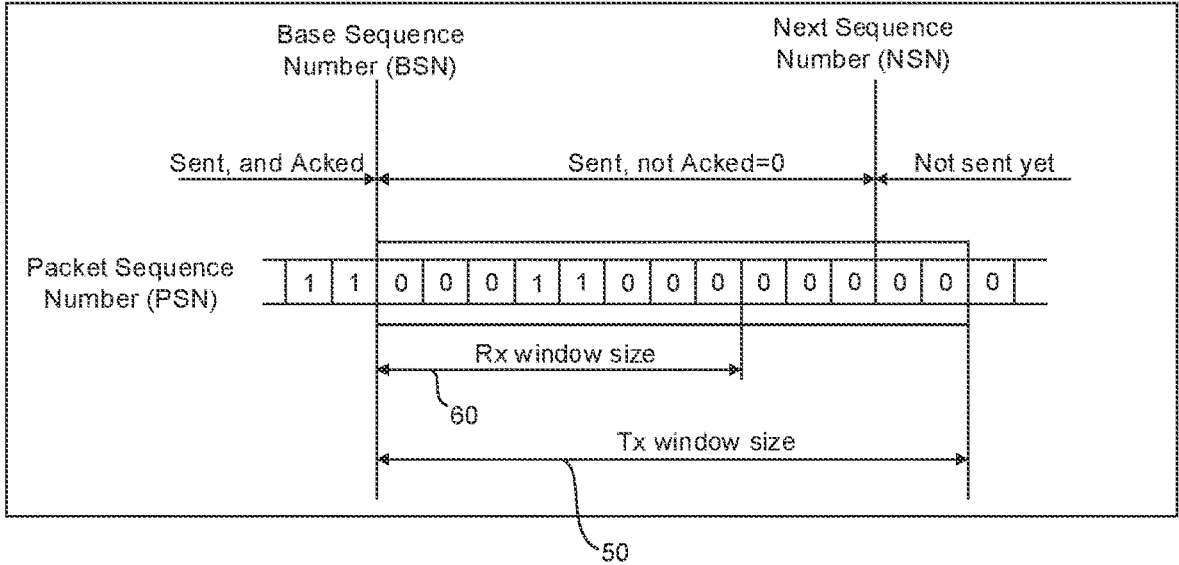
FIG. 2 is a diagram showing an example of transmit and receive sliding windows on which bitmaps of an embodiment are based.

FIG. 2 is a diagram showing an example of a transmit sliding window 50 and a receive sliding window 60 on which bitmaps of an embodiment are based. The bits in the transmit sliding window 50 indicate whether or not a transmitted packet has been acknowledged by the receiver. The bits in the receive sliding window 60 indicate whether a transmitted packet has been received by the receiver. In the case of FIG. 2, the bits in the receive sliding window 60 are the same as the corresponding bits in the transmit sliding window 50 indicating, for example, that the first packet of the windows was not received by the receiver and, accordingly, was not acknowledged by the receiver. In any event, the transmit sliding window 50 moves when the lowest-number, unacknowledged transmit packet is acknowledged, and the receive sliding window 60 moves when lowest-number, unreceived transmit packet is received. For each of the transmit sliding window 50 and the receive sliding window 60, the first bit of the window corresponds to the base sequence number (BSN) for the window.

When a connection is alive, the bits in the sliding windows are updated and the windows are moved as needed. If the connection is interrupted, the bits and sequence numbers of the sliding windows at the time of interruption become the bits and sequence numbers of the bitmaps that will be stored as the connection state of the interrupted connection. In an embodiment, the sliding windows for a connection are maintained in a cache memory, e.g., an on-chip SRAM of a NoC, when the connection is alive, and are converted to bitmaps which are stored in a system memory, e.g., an off-chip DRAM coupled to a NoC, when the connection is interrupted. To conserve system memory bandwidth, the bitmaps may be compressed prior to writing to the system memory, and decompressed after reading from system memory.

It should be noted that the word "interrupted" is used in this disclosure to refer to scenarios in which a connection between two nodes is temporarily suspended, as well as to scenarios in which a connection between two nodes transitions from being freely executed to being interleaved with one or more other connections.

Regarding interleaving, it is further noted that a node can communicate simultaneously with multiple other nodes in a network. For example, a node 0 can communicate simultaneously with a node 1, a node 2, a node 3, node 4 . . . a node N, and each such communication may define a connection having a connection state which can be stored/retrieved from a system memory. In a more specific example:

Connection A=node 0<-->node 1
    Connection B=node 0<-->node 2
    Connection C=node 0<-->node 3
    Connection D=node 0<-->node 4
    . . .
    Connection Z=node 0<-->node N
And packets in the connections can be interleaved as:
    Time 0—Pkt1 sent—Connection A
    Time 10—Pkt2 received—Connection C
    Time 15—Pkt3 sent—Connection A
    Time 18—Pkt4 sent—Connection Z
    Time 20—Pkt5 received—Connection B
    Time 21—Pkt6 received—Connection D
Every time a packet is processed for a connection the connection state is updated, which requires retrieval of the connection state. Also, the retrieved connection state would need to be stored back to system memory if there is a conflicting connection or higher priority connection which needs to be serviced. That is, since there is limited on-chip memory, only a few connections can be on-chip at the same time, and therefore if there is a requirement to service a conflicting connection or higher priority connection the connection state for a currently on-chip connection must be moved off-chip so that the connection state for the conflict-ing connection or higher priority connection can be moved on-chip.

Figure 3:
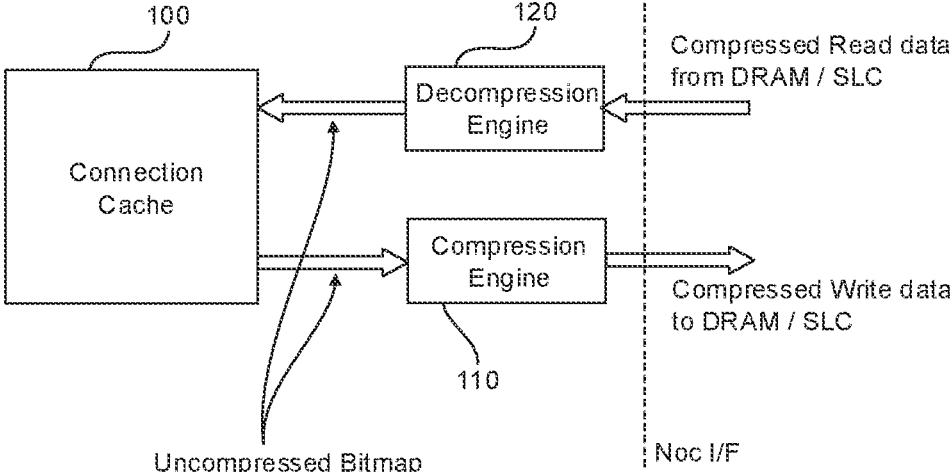
FIG. 3 is a block diagram showing a connection cache, compression engine, and decompression engine of an embodiment.

FIG. 3 is a block diagram of a system for managing sliding windows and bitmaps according to an embodiment. The system includes a connection cache 100 for storing sliding windows and forming bitmaps, a compression engine 110 for compressing bitmaps when the bitmaps are written from the connection cache 100 to a system memory, and a decompression engine 120 for decompressing bitmaps when the bitmaps are read by the connection cache 100 from the system memory. In the configuration depicted in FIG. 3, the connection cache 100, compression engine 110, and the decompression engine 120 are on an integrated circuit chip with a NoC. The compression engine 110 performs inline compression on bitmaps that are to be stored to an on-chip or off-chip DRAM or an on-chip system level cache (SLC). The decompression engine 120 performs inline decompres-sion on bitmaps that are read from the DRAM or SLC.

The compression scheme implemented by the compres-sion engine 110 and the decompression engine 120 is a lossless compression scheme as connection state informa-tion is critical to correct functionality. The primary motiva-tion for compressing the bitmaps is to conserve the NoC/DRAM bandwidth, which is a critical resource. Another motivation is to reduce the storage cost associated with bit maps, and in worst case scenarios the storage requirement for compressed bitmaps would be exactly the same as the storage requirement for the raw bitmaps. Given a fixed bitmap scheme, the write/read for connection states would be of variable size, based on the respective compression efficiencies for the connection states, and would ensure that only relevant bytes of the bitmaps are written and read.

An example of a bitmap scheme that may be used to describe connection states is shown below in Table 1.

TABLE 1

| Bitmap | Bytes |
|---|---|
| RX - Request Window | 8 |
| RX - Ack - Data Window | 16 |
| RX - Receive - Data Window | 16 |
| TX - Request window | 8 |
| TX - Data window | 16 |
| Total | 64 |

As can be seen from Table 1, the bitmap scheme includes five bitmap types, a receiver request window bitmap (RX—Request window) that is 8 bytes long, a receiver acknowl-edged data window bitmap (RX—Ack—Data window) that is 16 bytes long, a receiver data window bitmap (RX—Receive—Data window) that is 16 bytes long, a transmitter request window bitmap (TX—Request window) that is 8 bytes long, and a transmitter data window bitmap (TX—Data window) that is 16 bytes long. The receiver request window bitmap tracks request packets that have been received by the receiver from the transmitter. The receiver acknowledged data window bitmap tracks data packets that have been received by the receiver from the transmitter and acknowledged by the receiver. The receiver data window bitmap tracks data packets that have been received by the receiver from the transmitter. The transmitter request win-dow bitmap tracks receipt by the transmitter of acknowl-edgments sent by the receiver in response to request packets sent by the transmitter to the receiver. The transmitter data window bitmap tracks receipt by the transmitter of acknowledgements sent by the receiver in response to data packets sent by the transmitter to the receiver. Although the bitmap types herein are described with reference to particular bit-lengths, it is understood that the size of each of the bitmap types may vary from example-to-example.

Typically, the bitmaps will be sparsely populated with set bits (e.g., 1's) with most of the bitmap bits being un-set (e.g., 0's). There are two reasons for the small number of set bits. First, a bit is set in a bitmap only when a packet is received out of order (OOO), or only when an acknowledgement for a packet is received OOO; however, receiving packets/acknowledgments OOO is not a typical scenario for an ordered network where packets/acknowledgments would be received in order and the only scenarios in which packets/acknowledgments are received OOO are due to packets being dropped during path switching events. Second, the number of bits set in a bitmap is limited by the total number of packets outstanding/inflight, which limits the total num-ber of bits that can be set in the bitmaps across all connec-tions.

In any event, the uncompressed input to the compression engine 110 may be a concatenation of bitmaps. For the Table 1 scheme, the input vector (or "input bitmap") may be equal to {rx_req_wdw, rx_ack_data_wdw, rx_rcv_data_wdw, tx_req_wdw, tx_data_wdw}, and would therefore have a length of 512 b (64 B).

Figure 4A:
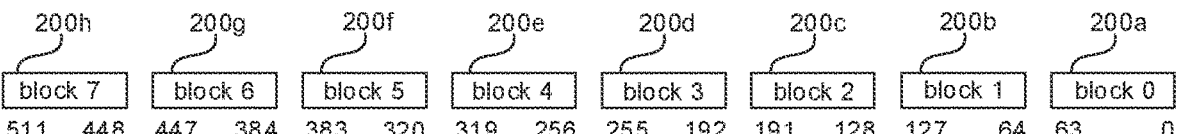
FIG. 4A is a diagram showing blocks of an input vector according to an embodiment.
Figure 4B:
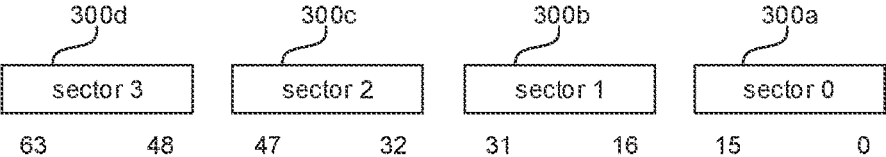
FIG. 4B is a diagram showing sectors of a block according to an embodiment.

The input vector may be partitioned into blocks of equal size. This enables modular design and inline compression/decompression. Thus, for the Table 1 scheme, the input vector may be partitioned into blocks of 64$b$. FIG. 4A is a diagram showing blocks 200a-200h into which the input vector for the Table 1 scheme may be partitioned. The unit for compression/decompression is a block, and thus for the Table 1 scheme the compression engine 110 and decom-pression engine 120 would have 8 instances to cover the entire 512 b. Each block may have a valid bit to indicate if any of the bits are set in that block. Each block may be further partitioned into sectors of equal size, and each sector may include a valid bit to indicate if any of the bits in the sector are set. Thus, for the Table 1 scheme, each of blocks 200a-200h may be partitioned into sectors of 16$b$. FIG. 4B is a diagram showing sectors 300a-300d of a block accord-ing to the Table 1 scheme. In some examples, the input vector is partitioned directly into groups of sectors, each group including an equal number of sectors. In those examples, the groups of sectors may be referred to as blocks.

Having described the input vector and its partitioning, the remaining description is provided in the context of the Table 1 scheme for purposes of concise description. However, upon review of this description, one skilled in the art will readily appreciate how the present technology can be applied in other contexts.

In an embodiment, each valid sector can be either in the raw format or run length encoded (RLE). By way of example, when the encoding type=1, the segment is encoded using RLE and when the encoding type=0, the segment is encoded as raw. The format for both the encodings may be as shown in Tables 2 and 3 below.

RLE

TABLE 2

| Field | Width | Description |
|---|---|---|
| start_offset | 4 | This field is used to indicate where the run of 1's appears in the uncompressed vector. The value determines the bit position of the first bit of the |

TABLE 2-continued

| Field | Width | Description |
|---|---|---|
| | | run within the sector. |
| end_offset | 4 | The value determines the bit position of the last bit of the run within the sector. |

Raw

TABLE 3

| Field | Width | Description |
|---|---|---|
| data | 16 | This field provides the sector data in the uncompressed format |

Figure 5:
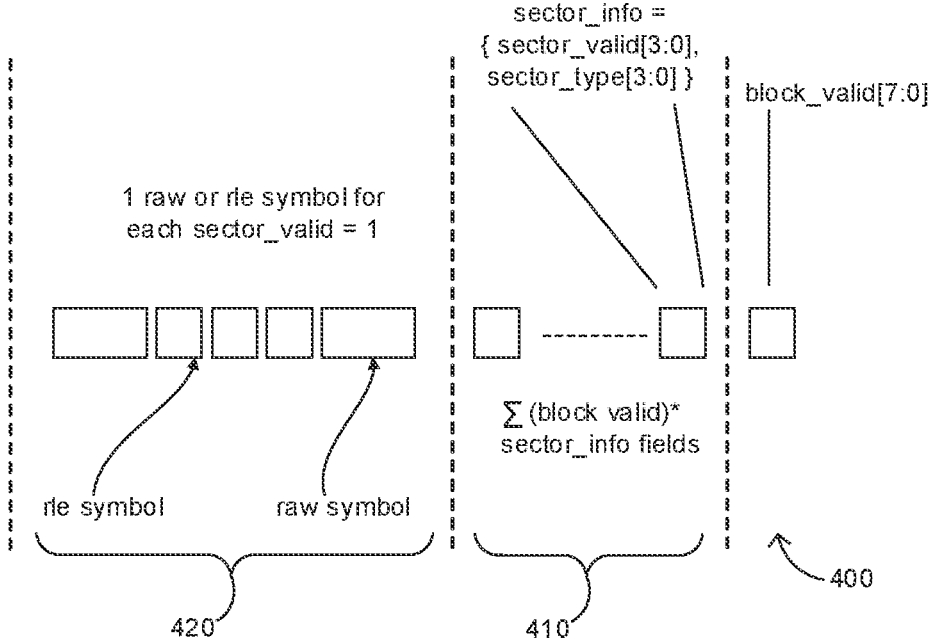
FIG. 5 is a diagram showing a format of a compressed vector according to an embodiment.

The format for a compressed vector may be as shown in FIG. 5. Referring to FIG. 5, the block_valid[7:0] (figure reference 400) indicates the blocks that have at least a single bit set in the input vector. For each of the blocks which have the block_valid bit set there will be additional information. Each block_valid bit has a sector information sequence, the sector_info={sector_valid[3:0], sector_type[3:0]} (figure reference 410), to indicate the valid sectors and the encoding type. All the valid blocks have their sector info appended, and finally the encoded symbols (figure reference 420) would form the last segment of the compressed format. Based on the encoding type, the encoded symbols will be either 8 b for RLE or 16 b for raw.

The compressed vector length can be calculated using the following formula.

| | |
|---|---|
| Length (bytes) = 1 + | // block_valid[7:0] |
| ( Σ block_valid[7:0] ) + | // {sector_valid[3:0], sector_type[3:0]} |
| ( Σ (sector_valid & sector_type) ) + | // RLE segments |
| ( Σ (sector_valid & ~sector_type) ) * 2 | // Raw segments |

For example, the compressed vector length, in bytes, can be calculated as the sum of one plus the number of blocks that have at least one single bit set in the input vector plus the sum of valid RLE segments plus twice the sum of valid raw segments. The compression engine 110 may have one or more interfaces for accommodating the signals shown in Table 4 below.

TABLE 4

| Signal name | Input/output | Signal width (bits) | Explanation |
|---|---|---|---|
| c_valid_in | Input | 1 | Input bit vector is valid |
| c_data_in | Input | 512 | Input bit vector to be compressed |
| c_valid_out | Output | 1 | Output compressed data is valid |
| c_data_out | Output | 512 | Compressed data |
| c_data_len | Output | 10 | Length of compressed data. (Length == 512) indicates no compression |

The decompression engine 120 may have one or more interfaces for accommodating the signals shown in Table 5 below.

TABLE 5

| Signal name | Input/output | Signal width (bits) | Explanation |
|---|---|---|---|
| d_valid_in | Input | 1 | Compressed data is valid |
| d_data_in | Input | 512 | Compressed input data |
| d_data_len | Input | 10 | Length of compressed data. (Length == 512) indicates input data is not compressed. |
| d_valid_out | Output | 1 | Output decompressed data is valid |
| d_data_out | Output | 512 | Decompressed bit vector |

Regarding performance, the compression ratios for a few different scenarios are shown in Table 6 below. In the table, the compression ratio=input vector/compressed vector.

TABLE 6

| Pattern | Ratio | Output Length (bytes) | Description |
|---|---|---|---|
| All 0's | 64 | 1 | block_valid = 0 |
| All 1's | 1.56 | 41 | block_valid = 0xFF, sector_valid* = 0xF All the sectors would use RLE. |
| Random 50% | 1 | 64 | block_valid = 0xFF, sector_valid* = 0xF |
| 1's in all bitmaps | | | All the sectors would use Raw. If the output length is >= input length, it is implicit that there is no compression/ decompression done and no part of the input vector is compressed. |
| ~16 packets OOO arrival/ OOO ack | 4 | 16 | block_valid = 0xAD, each of the 5 bitmaps would have random LSB bits set. sector_valid = 0x1 All the sectors would use raw encoding |

Figure 6:
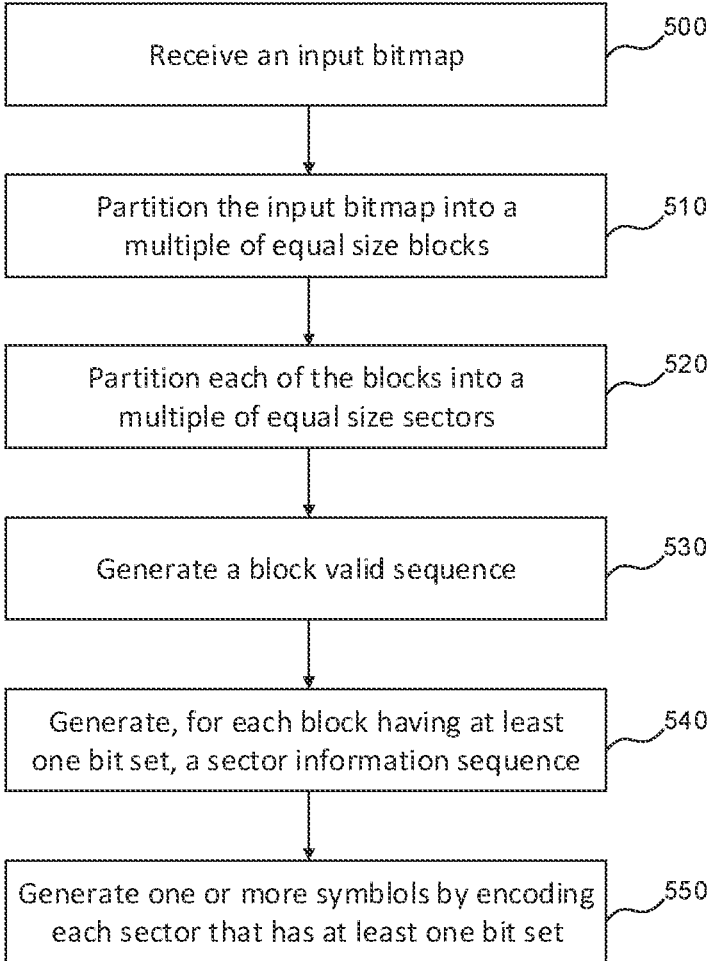
FIG. 6 shows a flowchart of a compression operation according to an embodiment.

Referring now to FIG. 6, the figure shows a flowchart of a compression operation according to an embodiment. As can be seen from the figure, a method for compressing connection state information may begin with receiving an input bitmap (step 500). The input bitmap may include a sequence of bits describing transmit states and receive states for packets in a connection between a first node on a network and a second node on the network, each bit in the sequence of bits being either set or not set. The input bitmap is partitioned into a multiple of equal size blocks (step 510), and each block is partitioned into a multiple of equal sized sectors (step 520). Next, a block valid sequence is generated (step 530), the block valid sequence indicating the blocks having at least one bit set. Further, for each block having at least one bit set, a sector information sequence is generated (step 540). The sector information sequence indicates, for the corresponding block, the sectors that have at least one bit set and an encoding type for each sector. Then, one or more symbols are generated by encoding each sector that has at least one bit set (step 550) according to the encoding type for the sector, such that each encoded sector corresponds to one of the symbols. The symbols are included in a compressed vector, such as a compressed vector like that depicted in FIG. 5.

Embodiments of the present technology include, but are not restricted to, the following.

(1) A method for compressing connection state information including receiving an input bitmap having a sequence of bits describing transmit states and receive states for packets in a connection between a first node on a network and a second node on the network, each bit in the sequence of bits being either set or unset; partitioning the input bitmap into a plurality of equal size blocks; partitioning each of the blocks into a plurality of equal sized sectors; generating a block valid sequence indicating the blocks having at least one bit set; generating, for each block having at least one bit set, a sector information sequence, the sector information sequence indicating, for the corresponding block, the sectors that have at least one bit set and an encoding type for each sector; and generating one or more symbols by encoding each sector that has at least one bit set, according to the encoding type for the sector, such that each encoded sector corresponds to one of the symbols.

(2) The method according to (1), wherein the encoding type for each sector is one of a raw type or a run length encoding type.

(3) The method according to (2), wherein the encoding type for a sector is the run length encoding type only when there is a single run of bits set in the sector.

(4) The method according to (3), wherein when a sector is encoded according to the run length encoding type, the symbol for the encoded sector includes a start offset indicating a bit position for the first bit of the single run, and an end offset indicating a bit position for the last bit of the single run.

(5) The method according to (1), wherein the input bitmap is a concatenation of bitmaps.

(6) The method according to (5), wherein the bitmaps include a transmitter request window bitmap, a transmitter data window bitmap, a receiver request window bitmap, a receiver data received window bitmap, and a receiver data received and acknowledged window bitmap.

(7) The method according to (1), further including the step of forming a compressed vector by concatenating the block valid sequence, the sector information sequences, and the symbols.

(8) The method according to (7), further including storage of the compressed vector.

(9) A system for compressing connection state information including at least one processor for controlling receiving an input bitmap having a sequence of bits describing transmit states and receive states for packets in a connection between a first node on a network and a second node on the network, each bit in the sequence of bits being either set or unset; partitioning the input bitmap into a plurality of equal size blocks; partitioning each of the blocks into a plurality of equal sized sectors; generating a block valid sequence indicating the blocks having at least one bit set; generating, for each block having at least one bit set, a sector information sequence, the sector information sequence indicating, for the corresponding block, the sectors that have at least one bit set and an encoding type for each sector; and generating one or more symbols by encoding each sector that has at least one bit set, according to the encoding type for the sector, such that each encoded sector corresponds to one of the symbols.

(10) The system according to (9), wherein the encoding type for each sector is one of a raw type or a run length encoding type.

(11) The system according to (10), wherein the encoding type for a sector is the run length encoding type only when there is a single run of bits set in the sector.

(12) The system according to (11), wherein when a sector is encoded according to the run length encoding type, the symbol for the encoded sector includes a start offset indicating a bit position for the first bit of the single run, and an end offset indicating a bit position for the last bit of the single run.

(13) The system according to (9), wherein the input bitmap is a concatenation of bitmaps.

(14) The system according to (13), wherein the bitmaps include a transmitter request window bitmap, a transmitter data window bitmap, a receiver request window bitmap, a receiver data received window bitmap, and a receiver data received and acknowledged window bitmap.

(15) The system according to (9), wherein the at least one processor is further operable to control forming a compressed vector by concatenating the block valid sequence, the sector information sequences, and the symbols.

(16) The system according to (15), wherein the at least one processor is further operable to control storage of the compressed vector.

(17) The system according to (9), further including a compression interface for receiving the input bitmap and for receiving an indication that the input bitmap is valid.

(18) The system according to (9), further including an interface for receiving the input bitmap and for providing an indication of the total number of bits in the symbols.

(19) The system according to (9), wherein the at least one processor is further operable to perform decompression on the symbols.

(20) The system according to (19), wherein the at least one processor is further operable to control forming a compressed vector by concatenating the block valid sequence, the sector information sequences, and the symbols, and the system further includes a decompression interface for outputting the compressed vector and an indication that the compressed vector is valid.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims.

The invention claimed is:

1. A method for compressing connection state information comprising:

receiving an input bitmap comprising a sequence of bits describing transmit states and receive states for packets in a connection between a first node on a network and a second node on the network, each bit in the sequence of bits being either set or unset;

partitioning the input bitmap into a plurality of equal size blocks;

partitioning each of the blocks into a plurality of equal sized sectors;

generating a block valid sequence indicating the blocks having at least one bit set;

generating, for a block of the plurality of equal size blocks having at least one bit set, a sector information sequence, the sector information sequence indicating, for the block of the plurality of equal size blocks, the sectors that have at least one bit set and an encoding type for each sector; and generating one or more symbols by encoding each sector that has at least one bit set, according to the encoding type for the sector, such that each encoded sector corresponds to one of the symbols, wherein the input bitmap is a concatenation of bitmaps, and wherein the bitmaps include a transmitter request window bitmap, a transmitter data window bitmap, a receiver request window bitmap, a receiver data received window bitmap, and a receiver data received and acknowledged window bitmap.

2. The method according to claim 1, wherein the encoding type for each sector is one of a raw type or a run length encoding type.

3. The method according to claim 2, wherein the encoding type for a sector is the run length encoding type only when there is a single run of bits set in the sector.

4. The method according to claim 3, wherein when a sector is encoded according to the run length encoding type, the symbol for the encoded sector comprises a start offset indicating a bit position for a first bit of the single run, and an end offset indicating a bit position for a last bit of the single run.

5. The method according to claim 1, further comprising a step of forming a compressed vector by concatenating the block valid sequence, the sector information sequences, and the one or more symbols.

6. The method according to claim 5, further comprising storing the compressed vector.

7. A system for compressing connection state information comprising:

at least one processor for controlling receiving an input bitmap comprising a sequence of bits describing transmit states and receive states for packets in a connection between a first node on a network and a second node on the network, each bit in the sequence of bits being either set or unset;

partitioning the input bitmap into a plurality of equal size blocks;

partitioning each of the blocks into a plurality of equal sized sectors;

generating a block valid sequence indicating the blocks having at least one bit set;

generating, for a block of the plurality of equal size blocks having at least one bit set, a sector information sequence, the sector information sequence indicating, for the block of the plurality of equal size blocks, the sectors that have at least one bit set and an encoding type for each sector; and generating one or more symbols by encoding each sector that has at least one bit set, according to the encoding type for the sector, such that each encoded sector corresponds to one of the symbols, wherein the input bitmap is a concatenation of bitmaps, and wherein the bitmaps include a transmitter request window bitmap, a transmitter data window bitmap, a receiver request window bitmap, a receiver data received window bitmap, and a receiver data received and acknowledged window bitmap.

8. The system according to claim 7, wherein the encoding type for each sector is one of a raw type or a run length encoding type.

9. The system according to claim 8, wherein the encoding type for a sector is the run length encoding type only when there is a single run of bits set in the sector.

10. The system according to claim 9, wherein when a sector is encoded according to the run length encoding type, the symbol for the encoded sector comprises a start offset indicating a bit position for a first bit of the single run, and an end offset indicating a bit position for a last bit of the single run.

11. The system according to claim 7, wherein the at least one processor is further operable to control forming a compressed vector by concatenating the block valid sequence, the sector information sequences, and the one or more symbols.

12. The system according to claim 11, wherein the at least one processor is further operable to control storage of the compressed vector.

13. The system according to claim 7, further comprising a compression interface for receiving the input bitmap and for receiving an indication that the input bitmap is valid.

14. The system according to claim 7, further comprising an interface for receiving the input bitmap and for providing an indication of a total number of bits in the symbols.

15. The system according to claim 7, wherein the at least one processor is further operable to perform decompression on the symbols.

16. The system according to claim 15, wherein the at least one processor is further operable to control forming a compressed vector by concatenating the block valid sequence, the sector information sequences, and the one or more symbols, and the system further comprises a decompression interface for outputting the compressed vector and an indication that the compressed vector is valid.

* * * * *